United States Patent [19]

Crawford et al.

[11] 4,364,995

[45] Dec. 21, 1982

[54] METAL/METAL OXIDE COATINGS

[75] Inventors: George H. Crawford, White Bear Lake; Edward J. Downing, St. Paul; Roy G. Schlemmer, Oakdale, all of Minn.

[73] Assignee: Minnesota Mining and Manufacturing Company, St. Paul, Minn.

[21] Appl. No.: 231,500

[22] Filed: Feb. 4, 1981

[51] Int. Cl.$^3$ .................... B32B 15/04; B32B 15/08
[52] U.S. Cl. .................... 428/336; 428/458; 428/460; 428/461; 428/464; 428/469; 428/472; 428/702; 428/697; 428/698
[58] Field of Search ............. 428/333, 336, 698, 702, 428/209, 471, 418, 458, 460, 461, 464, 474, 477.7, 216, 472, 469, 697

[56] References Cited

U.S. PATENT DOCUMENTS

| | | | |
|---|---|---|---|
| 3,091,548 | 5/1963 | Dillon | 428/216 |
| 3,639,185 | 2/1972 | Colone | 156/13 |
| 3,698,946 | 10/1972 | Kaspaul et al. | 117/211 |
| 3,962,488 | 6/1976 | Gillery | 427/109 |
| 4,008,084 | 2/1977 | Ikeda et al. | 96/35 |
| 4,139,391 | 2/1979 | Ikeda et al. | 96/115 R |
| 4,148,967 | 4/1979 | Satoh et al. | 428/418 |
| 4,158,079 | 6/1979 | Severus-Laubenfeld | 428/172 |
| 4,166,148 | 8/1979 | Sakurai | 428/702 |
| 4,190,321 | 2/1980 | Dorer et al. | 350/165 |

FOREIGN PATENT DOCUMENTS

| | | |
|---|---|---|
| 1468746 | 3/1977 | United Kingdom. |
| 1514420 | 6/1978 | United Kingdom. |
| 2028376 | 3/1980 | United Kingdom. |

OTHER PUBLICATIONS

E. M. DaSilva and P. White, "Electrical Properties of Evaporated Aluminum Oxide Films," J. Electrochemical Soc., vol. 109, No. 1, pp. 12-15 (1962).

L. H. Kaplan, "Aluminum Oxide Films from the Reaction of Aluminum and Water Vapor," Electrochemical Technology, vol. 3, No. 11-12, pp. 335-337 (Nov.-Dec. 1965).

J. J. Hauser, "Electrical and Structural Properties of Amorphous Metal-Metal-Oxide Systems," Physical Review B, vol. 7, No. 7, pp. 4099-4100 (1972).

Primary Examiner—William R. Dixon, Jr.
Attorney, Agent, or Firm—Cruzan Alexander; Donald M. Sell; Mark A. Litman

[57] ABSTRACT

Most processes for the generation of metal oxide or metal sulfide films involved oxidation of existing metal layers or direct vapor deposition of the oxide or sulfide layer. These processes do not provide efficient control of film integrity, optical properties, and bonding. The use of a metal vapor deposition process in which a controlled amount of oxygen or sulfur containing gas or vapor is introduced into the metal vapor stream or portions enables formation of metal oxide or metal sulfide films with excellent control over the film properties.

12 Claims, 1 Drawing Figure

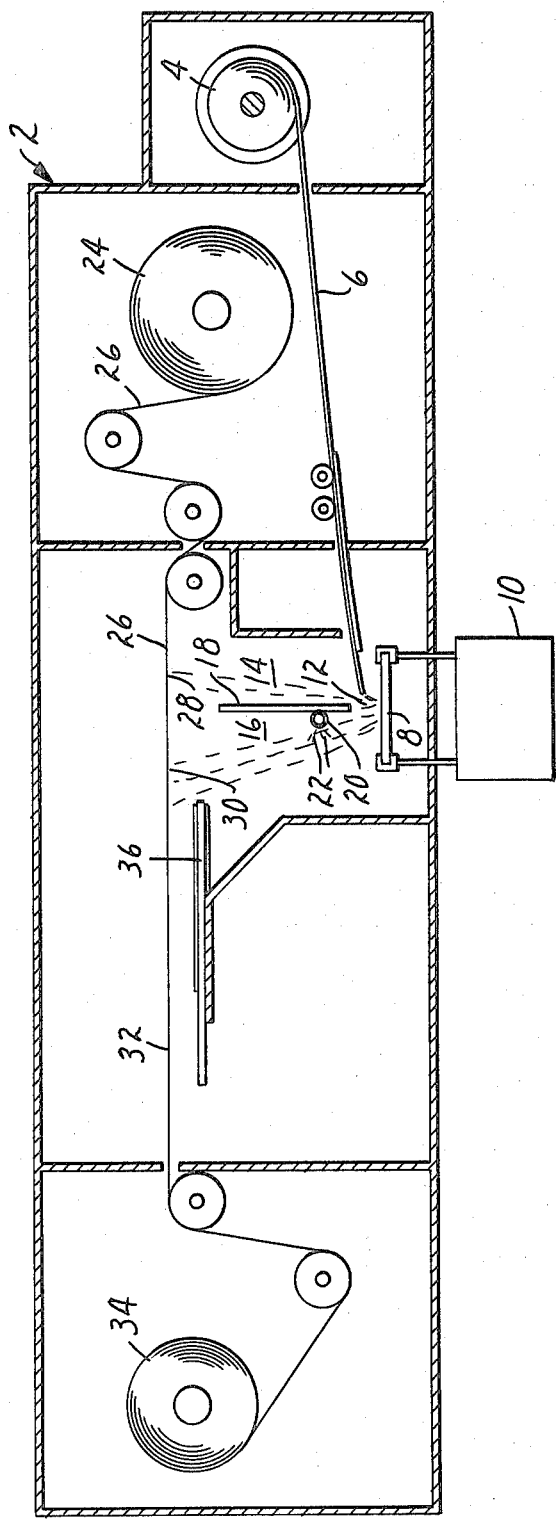

METAL/METAL OXIDE COATINGS

BACKGROUND OF THE INVENTION

1. Field of the Invention

This invention relates to a process for the vacuum deposition of metal (metal oxide and/or metal sulfide) layers on to substrates and to the articles produced thereby. The process provides for continuous application of materials to various substrates in a rapid fashion. Various metals may be oxidized in the coating procedure.

2. Description of the Prior Art

The vacuum deposition of metals and metal oxides to substrates has been practiced for many years. The uses for such metallized articles are well known and varied. The application of a metal to a surface has provided either optical qualities, such as mirror-like or reflective surfaces, or light transmissive surfaces (e.g., U.S. Pat. No. 4,190,321). Metal layers and metal oxide layers made by a batch process have also been provided for their contribution of electrical (e.g., conductive or semiconductive) properties. (Electrochemical Technology, Vol. 3, No. 11-12, pp. 335-337).

The application of metal oxide layers, and particularly aluminum oxide layers, has traditionally been performed by sputtering or electron beam techniques or by oxidation of the prior deposited metal. For example, aluminum oxide is formed by processes in which an aluminum layer is first vacuum or vapor deposited and subsequently converted to alumina (e.g., U.S. Pat. Nos. 4,190,321 and 4,158,079). Particularly when anodizing is performed to convert aluminum to alumina, high energy costs and time-consuming steps may be encountered.

The properties of the thus produced alumina layers have also been found to be less consistent than is desirable for certain applications. For example, under alkaline conditions, the alumina layer tends to separate from the substrate and may fail to hold additional polymeric layers coated thereon.

Certain metal oxides and in particular aluminum oxide have traditionally not been used in certain types of imaging processes because of difficulty encountered when etching an aluminum layer. Extreme manufacturing procedures such as the inclusion of different metals into aluminum and alumina layers in order to overcome the undesirable properties of the aluminum and alumina materials have been proposed (e.g., U.S. Pat. No. 4,008,084). These procedures have not generally provided uniform results in an economic and straightforward manner.

SUMMARY OF THE INVENTION

It has been found according to the present invention that desirable metal oxide or metal sulfide containing layers may be formed during continuous vapor or vacuum deposition of metal layers onto substrates. It has been found that the composition of the metal/(metal oxide or sulfide) containing layer may be controlled and even varied over its thickness by regulation of components in the vapor stream in the vapor coating chamber.

Such metal/(metal oxide or sulfide) containing layers have been found to provide good adhesion to the substrate on which they are coated and to provide additional good adhesion to other layers coated thereon. The process has been found to be rapid, economically efficient and to provide coatings of uniform quality.

BRIEF DESCRIPTION OF THE DRAWINGS

The FIGURE shows an apparatus which would be useful in performing the process of the present invention.

DETAILED DESCRIPTION OF THE INVENTION

The present invention is practiced in conventional vapor deposition environments into which there may be the controlled release of the reactive materials, oxygen, water vapor, sulphur vapor, or $H_2S$. By the controlled introduction of these materials into the metal vapor stream of conventional vapor deposition apparatus during the vapor deposition of metals onto substrates, controlled conversion of the metal to metal oxides or metal sulfides is effected. The introduction of these oxygen or sulfur containing vapors must be confined to specific regions of the vapor stream or to the chamber. This minimizes degradation of components of the apparatus and enables control over both the composition and the gradation in the composition of the coated layer across its thickness.

Vapor or vacuum deposition of metals is a well-established practice in the coating art. The present invention does not require drastic modification of the vacuum deposition processes and apparatus as known in the art except for the means of controlling the introduction of the reactive materials described above. By controlling the amount and, also importantly, the point at which the reactive vapor or gas is introduced, the proportion of metal to metal oxide in the layer can be readily controlled. For 100% conversion of the metal to metal oxides or metal sulfides at a given level of the coating, at least a stoichiometric amount of the oxygen or sulfur containing gas or vapor must be introduced to a portion of the metal vapor stream. The presence of measureably larger amounts is undesirable and can cause oxidation of the components of the apparatus.

Substantially any metal capable of forming an oxide can be used in the practice of this invention. In particular aluminum, tin, chromium, nickel, titanium, cobalt, zinc, iron, lead, manganese, copper and mixtures thereof can be used. Not all of these metals when converted to metal oxides according to this process will form materials having all of the specifically desirable properties (e.g., optical density, light transmissivity, etc.). However, all of these metal oxide containing layers formed according to the practice of the present invention will be useful and contain many of the benefits of the present process including bondability to polymeric materials, including paints and varnishes. The metal vapors in the chamber may be supplied by any of the various known techniques suitable for the particular metals, e.g., electron beam vaporization, resistance heaters, etc. Reference is made to *Vacuum Deposition of Thin Films,* L. Holland, 1970, Chapman and Hall, London, England with regard to the many available means of providing metal vapors and vapor coating techniques, in general. This prior art is incorporated herein by reference.

Metal oxide containing layers according to the practice of the present invention may be deposited as thin as layers of molecular dimensions up through dimensions in micrometers. The composition of the layer throughout its thickness may be readily controlled as herein described. Preferably the metal/metal oxide or sulfide layer will be between 50 and 5000 Å in its imaging utilities, but may contribute bonding properties when 15 Å, 25 Å or smaller and structural properties when $5 \times 10^4$ Å or higher.

The conversion to graded metal oxide or metal sulfide is, as previously described, effected by the introduction of oxygen, sulfur, water vapor or hydrogen sulfide at points along the metal vapor stream. By thus introducing these gases or vapors at specific points along the vapor stream in the vapor deposition chamber, a coating of a graded composition (throughout either thickness of the layer) may be obtained. By selectively maintaining a gradation of the concentration of these reactive gases or vapors across the length of the vapor deposition chamber through which the substrate to be coated is being moved, an incremental gradation of the composition of the coating layer (throughout its thickness) is obtained because of the different compositions (i.e., different ratios of oxides or sulfides to metals) being deposited in different regions of the vapor deposition chamber. One can in fact deposit a layer comprising 100% metal at one surface (the top or bottom of the coating layer) and 100% metal oxide or sulfide at the other surface. This kind of construction is a particularly desirable one because it provides a strong coherent coating layer with excellent adhesion to the substrate.

The operation of the process of the present invention can be readily understood. A substrate which is to be coated continuously moves along the length of the chamber from an inlet area of the vapor deposition chamber to an outlet area. Metal vapor is deposited over a substantial length of the chamber, and the proportion of metal oxide or sulfide being codeposited with the metal at any point along the length of the chamber (or deposited as 100% oxide or sulfide) depends upon the amount of reactive gas or vapor which has entered that portion of the metal vapor stream which is being deposited at that point along the length of the chamber. Assuming, for purposes of illustration, that an equal number of metal atoms (as metal or oxides or sulfides) are being deposited at any time at any point along the length of the chamber, gradation in the deposited coating is expected by varying the amount of oxygen or sulfur containing reactive gas or vapor which contacts the metal vapor at various points or areas along the length of the chamber. By having a gradation of increasing amounts of reactive gas along the length of the chamber, one gets a corresponding gradation in the increased proportions of oxide or sulfide deposited. Deposition of metal vapor is seldom as uniform as that assumed, but in actual practice it is no more difficult according to the procedures of the present invention to locally vary the amount of oxygen, water, sulfur or hydrogen sulfide introduced into different regions of said metal vapor along the length of the surface of the substrate to be coated as the substrate is moved so as to coat the surface with a layer having varying ratios of metal/(metal oxide or sulfide) through its thickness. It is desirable that the reactive gas or vapor enter the stream itself and not just diffuse into the stream. The latter tends to cause a less controllable distribution of oxides within the stream. By injecting or focussing the entrance of the reactive gas or vapor into the stream itself, a more consistent mixing in that part of the stream is effected.

The process of the present invention enables a type of control over the composition and structure of the metal/metal oxide or sulfide coated article which could not heretofore be achieved. Other processes converted entire films of metals to metal oxides or sulfides, or produced coatings having one distinct region of metal and a sharp transition to a region of metal oxide or sulfide. This occurred because either the layer was laid down as a uniform composition of metal oxide or the process of converting a metal layer to metal oxide or sulfide tended to operate uniformly from the surface of the layer down, converting advancing areas of metal to metal oxides or sulfides in fairly distinct and sharply defined zones without vesting a significant region of gradation between differing compositions. Thus, a coating applied by prior art techniques such as oxidation of an existing metal layer may have a transition range of only 5 Å between the regions in the coating of pure metal and 100% metal oxide. In the present invention, transitions between compositions having varying proportions of metal oxide or sulfide to metal will occur over a thickness of at least 15 Å and usually at least 20 Å, which for the purposes of the present invention is defined as being a "continuous" variation. This region of transition can of course cover far greater dimensions such as 25, or 50, or 200 Angstroms or the entire thickness of the layer. It is a reasonable characterization of the products of the present invention to describe them as having a transition of at least 10% in the ratio of (metal oxide or sulfide)/metal or metal/(metal oxide or sulfide), whichever is the smallest value, which occurs over at least a 15 Å thickness in the coating. This transition region through the layer is generally uniform over the area which is coated and is not a discontinuous surface phenomenon. The transition in compositions could be reasonably described as being continuous as opposed to presenting a sharp discontinuous change in the proportions of metal to metal oxides and sulfides in the coating. The preferred materials of the present invention may be described as having this continuous change occur for 50% of the total change in the ratio of the compositions on the upper and lower surfaces over a thickness of at least 30% of the total thickness of the layer.

These transitional characteristics bear an important relationship to some of the properties of the products produced by the practice of the present invention. The coating has dispersed phases of materials therein, one the metal and the other the metal oxide or sulfide. The latter materials are often transparent or translucent, while the former are opaque. By controlling the amount of particulate metal which remains dispersed in the transparent oxide or sulfide phase, the optical properties of the coating can be dramatically varied. Translucent coatings of yellowish, tan, and gray tones may be provided, and substantially opaque black film may be provided from a single metal by varying the percentage of conversion of the metal to oxide during deposition of the coating layer according to the practice of the present invention.

The substrates of the present invention may comprise any materials which are presently known to be acceptable for the vapor deposition of metals, which includes substantially any material. Substrates may comprise metals, glasses, ceramics, organic polymers, inorganic polymers, thermoplastic resins, thermosetting resins, paper, fibrous materials, shaped articles, films, sheets, etc. In particular polymeric substrates of thermoplastic or thermosetting resins are preferred. Amongst the most useful resins are polyesters, polyacrylates, polycarbonates, polyolefins, polyamides, polysiloxanes, polyepoxides, etc. The substrates may be dyed or primed to promote adhesion or treated according to the various and sundry techniques known to provide different properties and characteristics to materials as may be desired in any specific instances, including dispersion of magnetizable, magnetic, metallic, or semiconductive particles, materials adding optical or electrical properties, flexibilizers, electrostatic reducing materials, antioxidants, etc.

Reference to the drawings will assist in an appreciation of the present invention.

FIG. 1 shows a vapor coating chamber 2 and all of its component parts. A source 4 of metal wire 6 supplies the metal wire to the region where it is to be vaporized. Multiple sources may of course also be used. A resistive heater 8 attached to power supply 10 is shown as an example of the vaporizing means. The metal vapor 12 passes on both sides of the chamber divided by a moveable baffle 18, into a downstream side (substrate outlet area) 16 and the upstream side (substrate inlet area) 14. If more than two components are desired, a second baffle and an additional vapor source (e.g., a second metal or second reactive gas) can be positioned within the chamber. A bleeder tube 20 allows the oxygen or sulfur containing vapor 22 to enter into the chamber so that it may combine with the metal vapor. In the FIGURE, the bleeder tube 20 is located on the downstream side of the moveable baffle 18. This enables production of an article with higher ratios of metal oxides or sulfides to metal at or near the surface of the coating as compared to the underside of the coating. This occurs because the baffle 18, in combination with an appropriately selected rate of gas inflow through the bleeder tube 20, enables some of the metal vapor 12 to be deposited on the upstream surface 28 without reacting with the gas or vapor 22 being emitted from the bleeder tube 20.

The surface to be coated according to the present invention may be supplied in a continuous fashion. This, in fact, is the preferred method of practicing the present invention. A roll supply of material 24 is fed out in continuous sheet form 26. A second baffle 36 parallel to the surface to be coated may be moved to shut off the surface from or expose the surface to the vapor stream. In the closed position, this baffle prevents overheating of the substrate during the warmup period when the substrate is generally stationary. The surface of the sheet 26 which is facing the metal vapor source on the upstream side 28 of the baffle 18 will have a higher metal/metal oxide or sulfide ratio than will the region at or near the surface on the downstream side 30 when the gas or vapor 22 is controlled. The surface or most of the surface 28 can be coated with essentially pure metal, if desired. By controlling the relative molar proportions of vapor 22 and metal vapor 12 being emitted into the chamber at any one time, the composition of the coating layer may be readily controlled. It is generally important that no more oxygen or sulfur than that necessary to convert the desired proportions of the metal vapor 12 to its oxide or sulfide be allowed into the chamber, or equipment will be oxidized or sulfided. By changing the position of the movable baffle 18 so that more of the metal vapor 12 is exposed to the vapor 22 from the bleeder tube 20, a greater portion of the thickness of the coating will contain oxides or sulfides. As the baffle 18 is moved in the upstream direction in this fashion, a greater volume of gas 22 may be emitted as more of the metal vapor would react as it is deposited. Contrariwise, as the baffle is moved in the opposite direction, less reactive gas 22 should be emitted or it will generally collect in the chamber and randomly react with metal vapor or the apparatus itself. The coated substrate 32 may then be collected on a roll 34.

As an alternative to the use of baffle 18, the oxygen or sulfur containing vapor stream may be introduced from an outlet relatively close to the surface of the substrate or merely further downstream. This will cause oxidation to occur in a localized area, again providing gradation in the coating. This may be practiced, for example, by providing a gas or vapor outlet which is located just below the surface to be coated and at a point which is less than 35% or more than 65% of the distance along the path in the coating area that the substrate must move to pass between the inlet and outlet areas of the chamber. The sharpness of the gradation may be controlled by regulating the distance between the reactive gas or vapor inlet and the surface to be coated. The sharpness may also be controlled by varying the gap between the moveable baffle 18 and the substrate 28 to be coated. This effectively controls the horizontal diffusion of the reactive gas or vapor and effectively provides higher proportions of the gas or vapor relative to the metal vapor at either the substrate inlet area or substrate outlet area. By having the gas or vapor introduced nearer the inlet area, an article may be produced having the coating with the greater oxide concentration between the metal coating and the substrate. This could provide good bonding characteristics or conductive and capacitive properties.

EXAMPLE 1

A suitable vapor coating of aluminum metal and aluminum oxide on a polyester substrate was obtained by the following method.

A conventional vacuum vapor-coater having two resistance heaters located 12 inches (30.5 cm) below the conveyor belt (web) was modified to include an oxygen bleeder tube and a baffle. The oxygen bleeder tube and a vertical baffle were of a length greater than the width of the web and the tube was situated parallel to the plane of the web and positioned directly above the center of each of the resistance heaters. The oxygen bleeder tube had about fifty holes equally spaced along its length and directed perpendicularly away from the baffle. The bleeder tube was positioned immediately next to and downstream of the vertical baffle and about 7 inches (15.8 cm) below the web. The baffle was of a length of sixteen inches (40.6 cm) and was situated perpendicular to the direction in which the web moves and extended from 2 inches (5.08 cm) below the web to 3 inches (7.62 cm) below the oxygen bleeder tube, passing beyond the tube and in contact with the upstream side of that tube so as to form a barrier preventing passing of the oxygen to the other side of the baffle.

The above-described vacuum vapor-coater was pumped down to a pressure of 0.2 microns (of mercury) and while the horizontal baffle was closed the resistance heaters were brought to a temperature sufficient to vaporize aluminum wire. Aluminum wire (1/16 inch thick) was then supplied to the resistance heaters. This permitted deposition of an aluminum metal vapor coating having a resistivity of 0.3 to 0.5 ohms/square when the web was moving at 20 to 25 feet (6.3 to 7.9 m) per minute. Concomitant with the heating of the resistance heaters and the feeding of the wire as described above, the pressure within the vapor-coater increased to about 0.5 microns. Oxygen was fed simultaneously into the vapor-coater through the oxygen bleeder tube at a rate less then stoichiometric equivalence which maintained the pressure within the vapor-coater approximately constant at about 0.5 microns. With the web moving at the above indicated rate and using a 0.004 inch-thick ($1.02 \times 10^{-4}$ m) film of polyethylene terephthalate as the substrate, a vapor coating was obtained which was shiny silver in appearance when viewed from the backside, namely through the polyester film (indicating essentially pure aluminum adjacent the polyester), and which was dark blue-black in appearance when viewed from the front-side indicating that a mixture of metal and metal oxide was present. The optical density of the vapor coating was 3.67. The coating directly in contact with the film was essentially pure aluminum and gradually the composition had more and more alumina towards the surface of the coated article.

The above vapor-coated substrate was suitable for employment as a substrate for a photographic resist imaging system. The substrate provided good bonding capability for coatings which were applied thereto.

EXAMPLE 2

The equipment described in Example 1 was used except that an electron beam source with a slug of aluminum was used in place of the resistance heaters and aluminum wire. The apparatus worked in a substantially identical fashion and the coated article was also substantially the same as that produced in Example 1.

EXAMPLE 3

A roll of 4 mil (102 micron) polyester, 10 inches (25.4 cm) wide, was set up and pumped to a pressure of 0.5 microns Hg ($5 \times 10^{-4}$ TORR). With the horizontal baffle closed, and using approximately 7 KW, two resistance heater bars were heated to approximately 2700° F. and the wire feed started at a rate of 4.6 gm/min. each. The sources were balanced and stabilized with the pressure now at 0.7 microns due to chamber outgassing. The web was started at a rate of 40 feet/min (13 m/min.) and the horizontal baffle over the sources was moved aside. A bright aluminum coating approximately 800 Å thick was produced. $O_2$ was now introduced through the bleeder at a rate of 10,000 liters/sec. at 1 micron Hg. There was no significant chamber pressure increase. The coating against the film remained bright but gradually, through the thickness of the coating, became a very dark "blue black."

The oxidation of some of the Al produced a less optically dense coating so the speed was adjusted to obtain the desired density; in this case approximately 20 ft./min. (6.5 m/min) produced a transmission optical density of 4.

EXAMPLE 4

All conditions were the same, but $O_2$ introduced at the rate of 2000 liters/sec. at 1 micron Hg produced a coating yellowish gold in color when viewed from the coated side, but bright metallic looking when viewed from back side, through the film.

EXAMPLE 5

Example 2 was repeated, except that a zinc slug was used in place of the aluminum slug. The results appeared substantially the same except that the vapor coating, when viewed through the film, was somewhat more gray than the aluminum. When viewed from the metal/metal oxide side of the film, it was more gray than black. The difference in contrast between the two sides was noticeable.

EXAMPLE 6

Example 1 was repeated, except that tin wire was used in place of the aluminum wire. The results were substantially the same as in Example 1.

EXAMPLE 7

Example 2 was repeated, except that a chromium slug was used in place of the aluminum slug. The resulting coating was quite satisfactory, exhibiting a shiny appearance when viewed through the film and a black opaque appearance on the metal/metal oxide surface.

What is claimed is:

1. An article comprising a substrate having on at least one surface thereof a coating comprising at least two components of (a) metal and (b) metal oxide or metal sulfide or combinations thereof of between 15 Å and $5 \times 10^4$ Å in thickness, said coating being characterized by having a composition which varies its proportions of said at least two components through a thickness of at least 15 Å in a continuous manner, said variation in proportions being further characterized by the ratio of said components only increasing or only decreasing through the thickness of the coating.

2. The article of claim 1 wherein the smaller of the coating layer's (a) metal to (b) metal oxide or metal sulfide or combinations thereof, or (c) metal oxide or metal sulfide or combinations thereof to (d) metal ratios varies by at least 10% over a thickness of at least 15 A.

3. The article of claim 2 wherein said metal oxide or metal sulfide or combinations thereof is a metal oxide.

4. The article of claim 3 wherein said metal is selected from the group consisting of aluminum, tin, chromium, nickel, titanium, cobalt, zinc, iron, lead, manganese, copper, and mixtures thereof.

5. The article of claim 3 wherein said metal is selected from the group consisting of aluminum, tin, chromium, nickel, titanium, zinc, and mixtures thereof.

6. The article of claim 3 wherein said metal comprises aluminum.

7. The article of claim 1 wherein said metal oxide or metal sulfide or combinations thereof is a metal sulfide.

8. An article comprising a substrate having on at least one surface thereof a coating comprising at least two components of (a) metal and (b) metal oxide or metal sulfide or combinations thereof of between 15 A and $5 \times 10^4$ A in thickness, said coating being characterized by having a composition which varies its proportions of said at least two components through a thickness of at least 15 A in a continuous manner, and said metal is selected from the group consisting of aluminum, nickel, titanium, zinc, tin, and mixtures thereof.

9. The article of claim 8 wherein said metal oxide or metal sulfide or combinations thereof is a metal oxide.

10. The article of claim 9 wherein said metal is selected from the group consisting of aluminum, zinc, tin and mixtures thereof.

11. The article of claims 8, 9, or 10 wherein the surface of said metal/metal oxide layer having a relatively higher proportion of metal is adjacent to said substrate.

12. The article of claims 8, 9, or 10 wherein said substrate comprises an organic polymeric material and wherein the surface of said metal/metal oxide layer having a relatively higher proportion of metal is adjacent to said substrate.

* * * * *